(12) United States Patent
Oh et al.

(10) Patent No.: US 6,580,380 B2
(45) Date of Patent: Jun. 17, 2003

(54) APPARATUS AND METHOD FOR TESTING LINEARITY OF AN ANALOG TO DIGITAL CONVERTER

(75) Inventors: Jung-Hoon Oh, Seoul (KR); Byeong-Hwan Cho, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/058,333

(22) Filed: Jan. 30, 2002

(65) Prior Publication Data

US 2002/0158783 A1 Oct. 31, 2002

(30) Foreign Application Priority Data

Apr. 30, 2001 (KR) ........................................ 2001-23515

(51) Int. Cl.[7] ................................................ H03M 1/10
(52) U.S. Cl. ...................................... 341/120; 341/118
(58) Field of Search ................................ 341/120, 118, 341/144; 375/226, 326, 371, 285

(56) References Cited

U.S. PATENT DOCUMENTS 6,246,717 B1 * 6/2001 Chen et al. ................. 375/226

* cited by examiner

*Primary Examiner*—Peguy Jeanpierre
*Assistant Examiner*—Joseph J Lauture
(74) *Attorney, Agent, or Firm*—Volentine Francos, PLLC

(57) ABSTRACT

A tester and method for testing linearity of an analog to digital converter without being influenced by noise, includes a controller that outputs a sampling frequency clock to convert an analog signal into a digital signal, that digitally filters the digitized code value, that generates a histogram responsive to the filtered digitized code value according to a predetermined program, and that controls display of the histogram; a signal generator that generates ground voltage and a triangular wave signal; an analog to digital converter that converts the analog triangular wave signal generated by the signal generator into a digital signal and that outputs the digital signal; a memory that stores the digitized code value converted by the analog to digital converter under control of the controller; and a display that displays the histogram related to the digitally filtered code value generated under control of the controller.

14 Claims, 4 Drawing Sheets

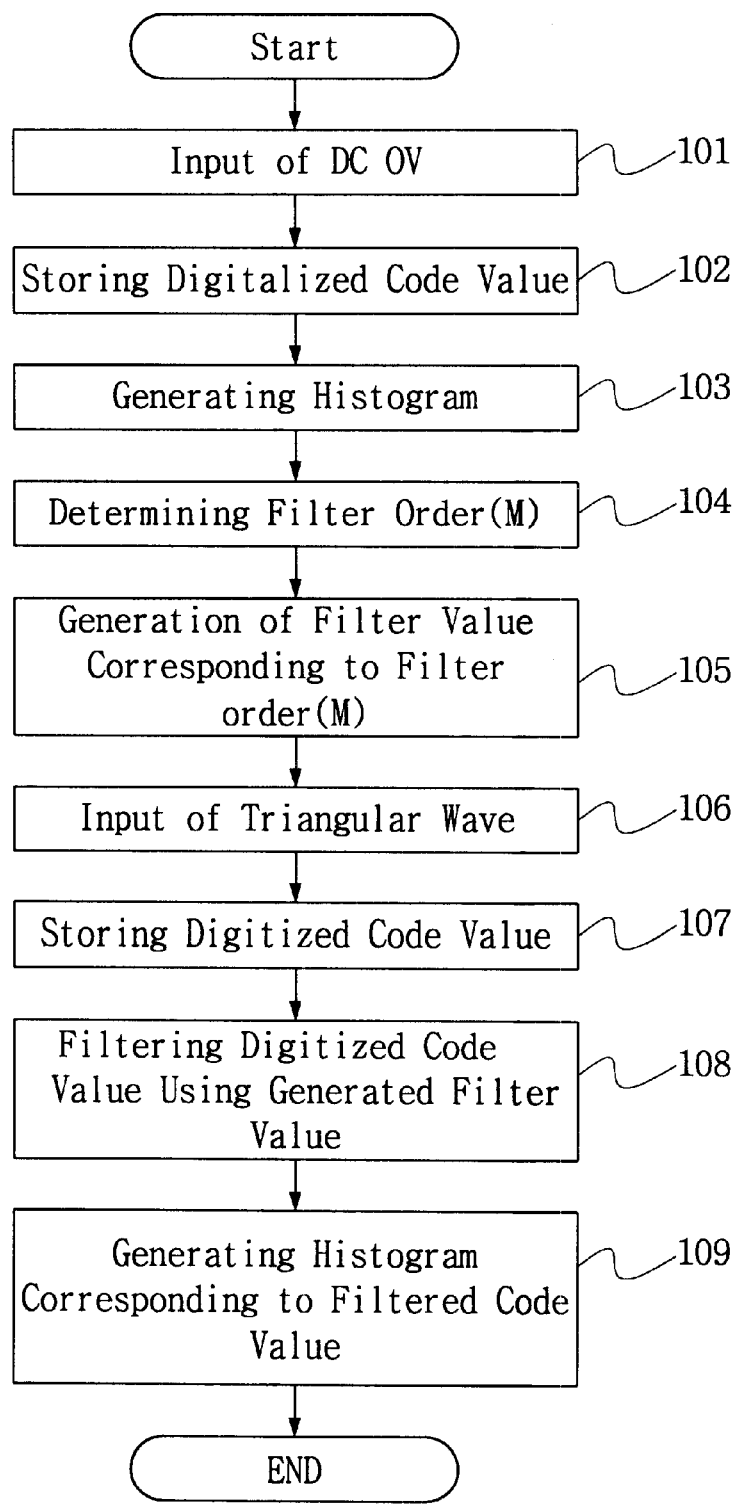

APPARATUS AND METHOD FOR TESTING LINEARITY OF AN ANALOG TO DIGITAL CONVERTER

The present application claims priority under 35 U.S.C. §119 to Korean Application No. 2001-23515 filed on Apr. 30, 2001, which is hereby incorporated by reference in its entirety for all purposes.

BACKGROUND OF THE INVENTION

1. Field of the Invention

The present invention relates to a linearity tester for an analog to digital converter and a method of testing an analog to digital converter for linearity, and more particularly to an apparatus and a method for testing linearity of an analog to digital converter without being influenced by noise.

2. Description of the Related Art

Generally, analog to digital converters have been developed and commonly used in digital devices, such as microprocessors and application specific integrated circuits (ASIC). The following items may be considered when testing an analog to digital converter: (1) an offset error in the analog to digital converter, which is a constant error irrelevant to input voltage; (2) a gain error that is included at a constant ratio to the input voltage; (3) an integral non-linearity error, which is seen in the output of the inverter as a variation of a curve deviated from an idealized straight line for a given input; (4) a differential non-linearity error, which is seen as a difference in the output of the converter that is due to an input voltage of an adjacent or previous input code; and (5) a MISS code, which is seen as the lack of an output of the converter in response to an analog input voltage applied to the analog to digital converter. Currently, in order to test an analog to digital converter with a logic tester, the only alternative is to purchase and use a tester that is optionally provided by the manufacturer of the analog to digital converter.

In FIG. 1, a conventional linearity tester for an analog to digital converter is illustrated. As shown in FIG. 1, the linearity tester for an analog to digital converter includes a controller 20 that outputs a resolution control signal to convert an analog signal to a digital signal, that provides control to test linearity of the digitized signal and that provides control to display a test signal; a signal generator 10 for generating a triangular wave signal; an analog to digital converter 12 for converting an analog triangular wave signal generated by the signal generator 10 into a digital signal and providing the digital signal as an output; a memory 14 for storing a code value digitized by the analog to digital converter under control of the controller 20; a histogram producer 16 for receiving the digitized code value from the memory 14 and generating a histogram under control of the controller 20; and a display 18 for displaying the histogram generated by the histogram producer 16 under control of the controller 20.

The signal generator 10 generates a triangular wave signal that is provided to the analog to digital converter 12. At this time, if the controller 20 inputs a sampling frequency clock to the analog to digital converter 12, the analog to digital converter 12 converts the analog triangular wave signal generated by the signal generator 10 into a digital signal according to the sampling frequency clock, and outputs the digital signal from the lowest level digital code to the uppermost level digital code step by step. Then, the controller 20 controls the memory 14 to store the digitized code converted by the analog to digital converter 12. Next, the controller 20 controls memory 14 so that the digitized code value stored therein is read out and provided to the histogram producer 16, which produces a histogram related to the digitized code value. The controller 20 controls the display 18 to display the histogram related to the digital code value. As an alternative, the digitized code value read from the memory 14 can also be made into a histogram using software, whereby the software generated histogram is thereafter displayed at the display 18.

The histogram illustrated at the display 18 is checked to evaluate linearity, with reference to the digitized code. The items considered for evaluation are differential nonlinearity, integral nonlinearity and the occurrence of a missing code. However, one of the problems associated with a conventional linearity tester for an analog to digital converter as described above is that the conventional tester cannot accurately test the linearity of the analog to digital converter, because the conventional tester is greatly influenced by noise having a higher level of resolution.

SUMMARY OF THE INVENTION

The present invention is therefore directed to an apparatus and method for testing linearity of an analog to digital converter, which substantially overcome one or more of the problems due to the limitations and disadvantages of the related art.

It is therefore an object of the present invention to provide a linearity tester for an analog to digital converter, and a corresponding method thereof, that accurately test linearity of an analog to digital converter without being influenced by noise.

It is another object of the present invention to provide a linearity tester for an analog to digital converter, and a corresponding method thereof, that minimize the influence of noise using a digital filter.

In order to accomplish the above noted and other objects, a linearity tester for an analog to digital converter of an embodiment of the present invention includes a controller that outputs a resolution control signal to convert an analog signal into a digital signal, that provides control to test linearity of the digitized signal and that provides control to display a test signal; a signal generator that generates a triangular wave signal; an analog to digital converter that converts the analog triangular wave signal generated by the signal generator into a digital signal and that outputs the digital signal; a memory that stores the digitized code value converted by the analog to digital converter under control of the controller; a digital filter that digitally filters and outputs the digital code value read out of the memory under control of the controller; a histogram producer that receives the digitized code value filtered by the digital filter and that generates a histogram responsive thereto; and a display that displays the histogram generated by the histogram producer under control of the controller.

In order to accomplish the above noted and other objects, a linearity tester for an analog to digital converter of a further embodiment of the invention includes a controller that outputs a sampling frequency clock to convert an analog signal into a digital signal, that digitally filters the digitized code value, that generates a histogram responsive to the digitally filtered signal according to a predetermined program, and that provides control to display the histogram; a signal generator that generates a ground voltage and an analog triangular wave signal; an analog to digital converter that converts the analog triangular wave signal generated by the signal generator into a digital signal and that outputs the digital signal; a memory that stores the digitized code value provided by the analog to digital converter under control of the controller; and a display that displays the histogram related to the digitally filtered code value generated under control of the controller.

In order to accomplish the above and other objects, a method for testing the linearity of an analog to digital converter of a further embodiment of the present invention includes generating a ground voltage; converting the ground voltage into a digital voltage value using the analog to digital converter; determining a filter order responsive to the digital voltage value; generating a digital filter value based on the determined filter order; converting an analog triangular wave signal into a digital code value using the analog to digital converter; digitally filtering the digital code value using the generated digital filter value to eliminate noise from the digital code value; and generating a histogram responsive to the filtered digital code value, to analyze linearity of the analog to digital converter.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a flowchart for testing the linearity of an analog to digital converter in accordance with a further embodiment of the present invention.

DETAILED DESCRIPTION OF THE PREFERRED EMBODIMENTS

Figure 1:
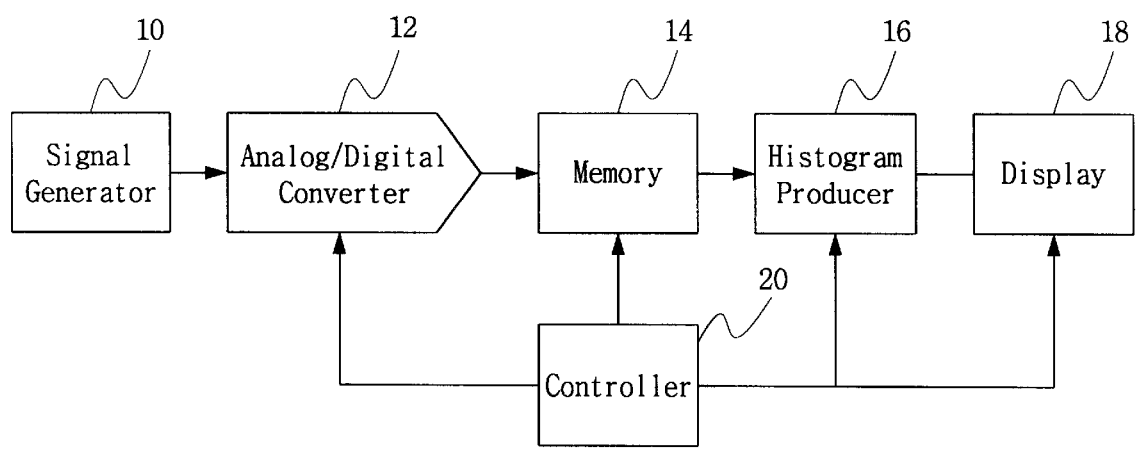
FIG. 1 illustrates a conventional linearity tester for an analog to digital converter.
Figure 2:
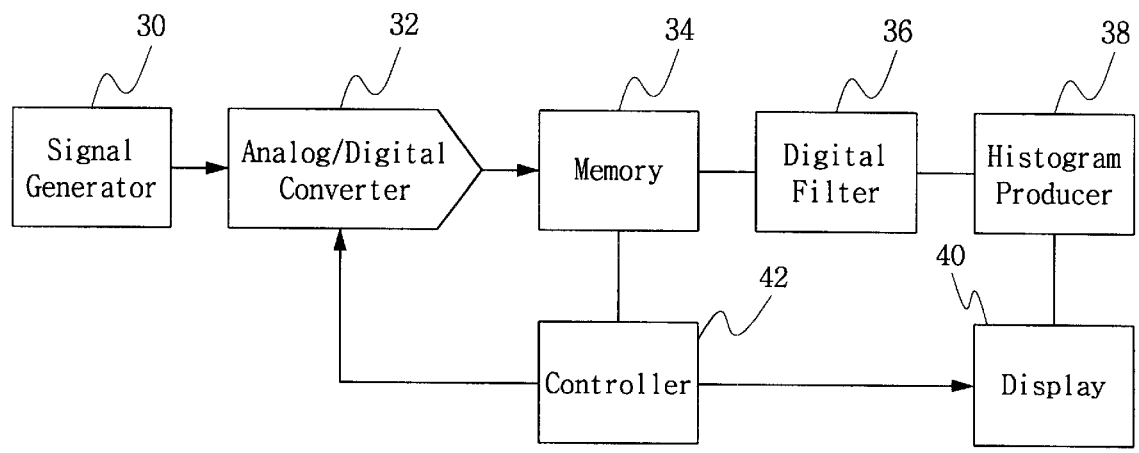
FIG. 2 illustrates a linearity tester for an analog to digital converter in accordance with an embodiment of the present invention.

FIG. 2 illustrates a linearity tester for an analog to digital converter in accordance with a first embodiment of the present invention. As shown in FIG. 2, the linearity tester for an analog to digital converter includes a controller 42 that outputs a resolution control signal to convert an analog signal into a digital signal, that provides control to test linearity of the digitized signal and that provides control to display a test signal; a signal generator 30 that generates a triangular wave signal; an analog to digital converter 32 that converts an analog triangular wave signal generated by signal generator 30 into a digital signal and that outputs the digital signal; a memory 34 that stores the digitized code value converted by analog to digital converter 30 under control of controller 42; a digital filter 36 that digitally filters and outputs the digital code value read out of memory 34 under control of controller 42; a histogram producer 38 that receives the digitized code value filtered by digital filter 36 and generates a histogram responsive thereto; and a display 40 that displays the histogram generated by histogram producer 38 under control of controller 42. A comb filter, which provides a type of finite impulse response, is used as digital filter 36, for instance.

Figure 3:
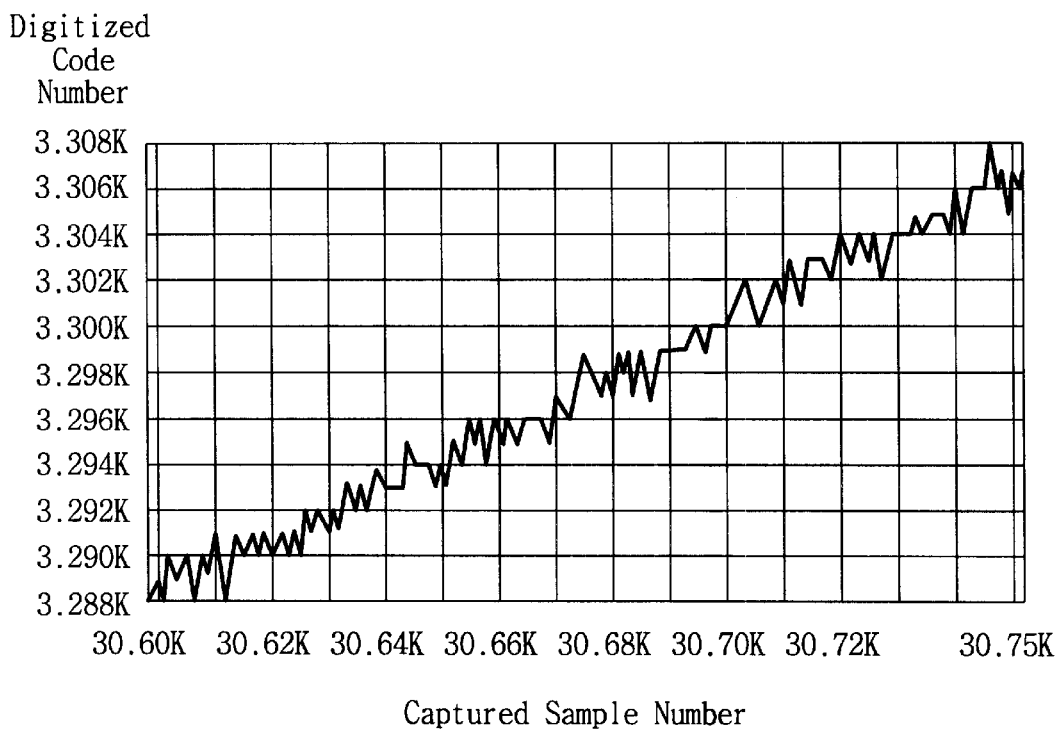
FIG. 3 illustrates in part a triangular waveform including noise.
Figure 4:
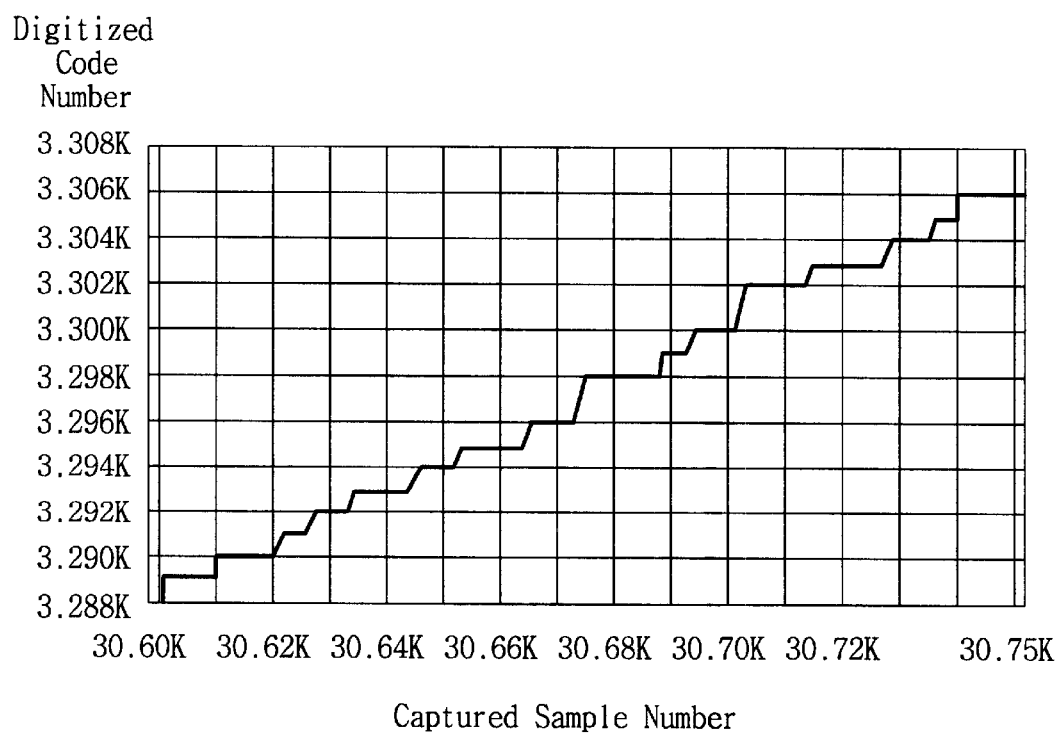
FIG. 4 illustrates in part a triangular waveform with noise eliminated.
Figure 5:
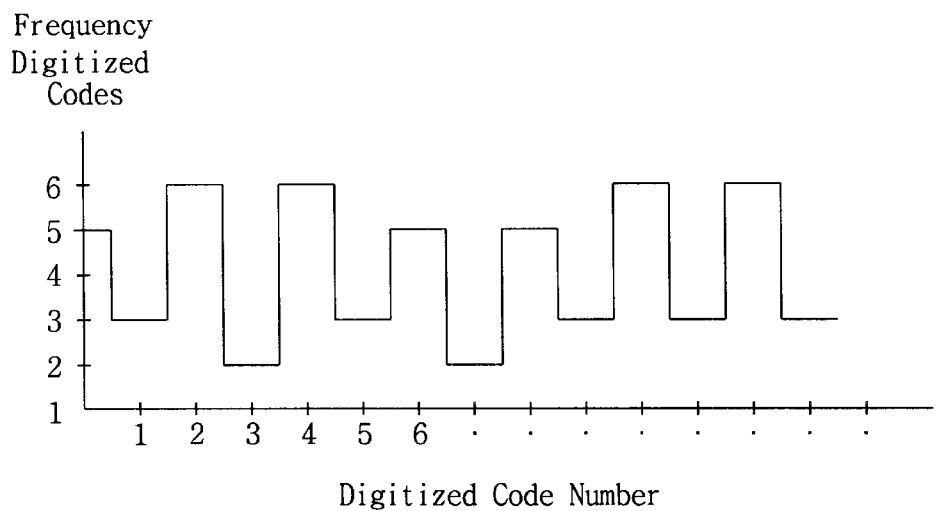
FIG. 5 illustrates a histogram related to digital code values in accordance with an embodiment of the present invention.

FIGS. 3 and 4 illustrate magnified portions in a data captured data plot. FIG. 3 illustrates a part of a triangular waveform including noise. FIG. 4 illustrates a part of a triangular waveform with noise eliminated. In FIGS. 3 and 4, the horizontal axes show a captured sample number and the vertical axes show a digitized code number. FIG. 5 illustrates a histogram related to digital code values in accordance with the present invention. In FIG. 5, the horizontal axis shows a digitized code number and the vertical axis shows the frequency of the digitized codes. With reference to FIGS. 2 through 5, an embodiment of the present invention will be described in detail as follows.

Signal generator 30 generates a triangular wave signal that is provided to analog to digital converter 32. For example, a triangular wave signal including noise as shown in FIG. 3, is output from signal generator 30 to the analog to digital converter 32. When a sampling frequency clock is input from controller 42, analog to digital converter 32 converts the analog triangular wave signal generated by signal generator 30 into a digital signal according to the input sampling frequency clock and outputs the digital signal step by step from a lowest level digital code to an uppermost level digital code. The sampling frequency clock is typically set to a lower frequency, such as 1 MHZ. However, it should be understood that any sampling frequency may generally be used. Also, the clock frequency of signal generator 30 should be synchronized with the sampling frequency of controller 42, so that a relatively accurate number of samples may be captured.

After conversion by analog to digital converter 32, controller 42 controls memory 34 to store the digitized code value output from analog to digital converter 32. Then, controller 42 controls memory 34 so that the stored digital code value is output from memory 34 to digital filter 36. Digital filter 36 then digitally filters the stored digital code value to output a triangular wave with noise eliminated, as shown in FIG. 4. Histogram producer 38 then generates a histogram related to the filtered digital code value provided by digital filter 36. Furthermore, controller 42 controls display 40 to display the histogram related to the digitized code value with noise eliminated, as shown in FIG. 5 for example.

It is noted that the histogram method may represent the frequency or bin of digitized samples. For example, if the rule to capture an input signal is 4 samples per each code in an analog to digital converter, the bin per each code will be 4 or 8 in the histogram. If the analog to digital converter has non-linearity error, the frequency per each code cannot be 4. For example, for a 2-bit analog to digital converter, the digitized codes are 00, 01, 10 and 11 binary codes, and if the rule is followed, the 00 code will have 4 bins in the histogram and vice versa in the ideal analog to digital converter. However, if the analog to digital converter has non-linearity error, the 00 code can have 3 bins, the 01 code can have 5 bins, the 10 code can have 2 bins, and the 11 code can have 6 bins. The result of this error is that the 00 code has −1 bin error, the 01 code +1 bin error, the 10 code −2 bin error and the 11 code +2 bin error, as compared to the ideal analog to digital converter. When each error is divided by 4 bins, the bin of the 00 code is −0.25, the 01 code is 0.25, the 10 code is −0.5 and the 11 code is 0.5.

Figure 6:
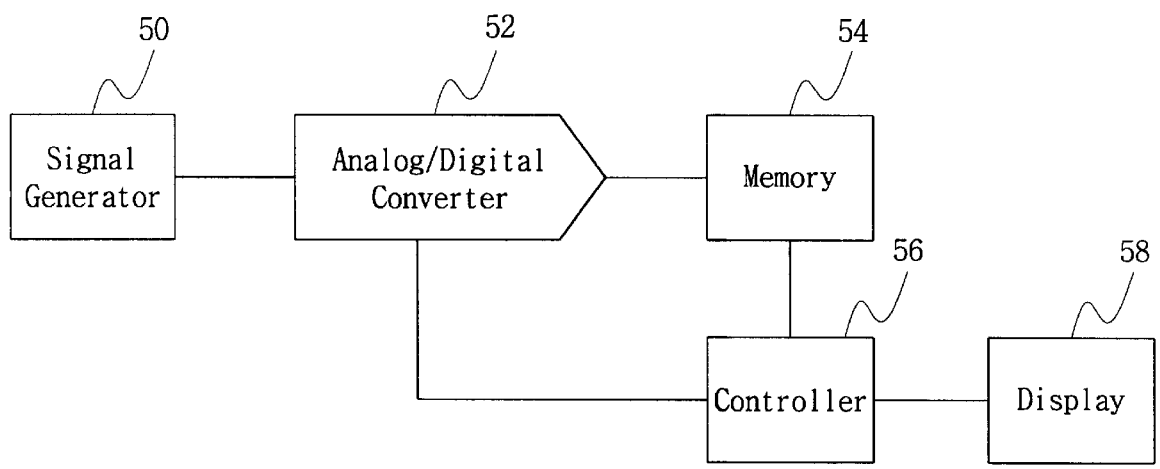
FIG. 6 illustrates a linearity tester for an analog to digital converter in accordance with another embodiment of the present invention.

A linearity tester for an analog to digital converter in accordance with another embodiment of the present invention is illustrated in FIG. 6 and described as follows. The linearity tester for an analog to digital converter as illustrated in FIG. 6 includes a controller 56 that outputs a sampling frequency clock for converting an analog signal into a digital signal, that digitally filters a digitized code value, that generates a histogram responsive to the digitally filtered code value according to a predetermined program, and that controls display of the histogram; a signal generator 50 that generates ground voltage of 0V and a triangular wave signal; an analog to digital converter 52 that converts the analog triangular wave signal generated by signal generator 50 into a digital signal and that outputs the digital signal; a memory 54 that stores the digitized code value converted by analog to digital converter 52 under control of controller 56; and a display 40 that displays the histogram related to the digitally filtered code value generated by the controller 50. Controller 52 functions as a comb filter in accordance with stored software, to provide a type of finite impulse response, in order to digitally filter the digitized code value provided from memory 54.

FIG. 7 is a flowchart for testing the linearity of an analog to digital converter in accordance with an embodiment of the present invention, which will be described in detail with reference to FIGS. 6 and 7 as follows.

The ground voltage of 0V including noise, is generated and output by signal generator 50 to analog to digital converter 52, in step 101. When a sampling frequency clock is input from controller 56, analog to digital converter 52 converts the ground voltage into a digital signal according to the sampling frequency clock, and outputs a digital signal step by step from a lowest digital code to an uppermost digital code. Then, at step 102, controller 56 controls memory 54 to store the digitized code value output from analog to digital converter 52. At step 103, controller 56 reads the digitized code value stored in memory 54 and generates a histogram responsive to the stored digitized code value, according to a predetermined program. At this time, a level of noise is analyzed based on the generated histogram and at step 104, controller 56 determines a filter order (M) by using the number of captures per code at every half period of a triangular wave. For instance, if 4 captures per code are set at the noise level of 2LSB, the filter order (M) should be under 8. If the filter order (M) is over 8, the resolution of the analog to digital converter 52 becomes lower than an actual resolution. At step 105, controller 56 generates a digital filter value corresponding to the filter order (M) determined based on the number of captures per code at every half period of a triangular wave and a level of noise with reference to the following formula:

$$H(z)=1/(M+1)\Sigma Z^{-k} \quad (1)$$

wherein k=from 0 to M.

At step 106, the triangular wave signal generated by signal generator 50 is input to analog to digital converter 52. For example, the triangular wave signal including noise as shown in FIG. 3, is generated by signal generator 50 and is output to analog to digital converter 52. When the sampling frequency clock is provided to analog to digital converter 52 from controller 56, analog to digital converter 52 converts the analog triangular wave signal generated by signal generator 50 into a digital signal according to the sampling frequency clock, and outputs the digital signal step by step from a lowest digital code to an uppermost digital code. Then, at step 107 controller 56 controls memory 54 to store the digitized code value output from analog to digital converter 52. At step 108, controller 56 reads the digital code value stored in memory 54, digitally filters the read digital code value with the digital filtering value determined in accordance with formula (1), based on formula (2), and outputs a code value corresponding to the triangular wave signal with noise eliminated, as shown in FIG. 4. Formula (2) is given as follows:

$$Y[n]=\Sigma h[m]x[n-m] \quad (2),$$

wherein m=from 0 to M−1, Y[n] is a code value, x[n] is an unfiltered value, and h[m] is a filter value. At step 109, controller 56 generates a histogram related to the code value corresponding to the triangular wave signal with noise eliminated, according to a predetermined program. Furthermore, controller 56 controls display 58 to display a histogram related to a code value corresponding to the triangular wave signal with noise eliminated as shown in FIG. 5.

It should be understood that LSB is a unit of resolution. When a 2-bit analog to digital converter (ADC) is considered for example, the 2-bit analog to digital converter has 4 digitized codes 00, 01, 10 and 11, as mentioned previously. That is to say, the analog to digital converter converts any input signal into one of these four codes. If a 2-bit analog to digital converter input is in the range of 0V to 3V, 1 LSB (Max Input Range−Min Input Range)/(ADC resolution)= (3−0)/(4). 2 LSB in this case means that a noise level is over 1 LSB, so that analog to digital converter resolution is influenced by a noise. If most noise influence is not bigger than 2 LSB, the 2 LSB is used to calculate the filter order. Incidentally, Z is a symbol used by z-transform.

As described above, there is an advantage in the linearity tester for an analog to digital converter of the present invention, in that the noise input from outside can be filtered with the digital filter to thereby accurately test the linearity of the analog to digital converter. In addition, the present invention is advantageous in improving the precision of a linearity test because the digitally filtered data is used in a method of generating a histogram to acquire differential nonlinearity and integral nonlinearity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for testing linearity of an analog to digital converter, comprising:

a controller that outputs a resolution control signal that is used to convert an analog signal into a digital signal, that provides control to test linearity of the digital signal, and that provides control to display a test signal;

a signal generator that generates an analog triangular wave signal;

an analog to digital converter that converts the analog triangular wave signal generated by said signal generator into the digital signal and that outputs the digital signal;

a memory that stores the digital signal output from said analog to digital converter as digitized code value, under control of said controller;

a digital filter that digitally filters the digitized code value stored in said memory to provide a filtered digital code value, under control of said controller;

a histogram producer that generates a histogram responsive to the filtered digital code value; and a display that displays the histogram generated by said histogram producer as the test signal, under control of said controller.

2. The apparatus of claim 1, wherein said digital filter is a finite impulse response filter.

3. The apparatus of claim 2, wherein said finite impulse response filter is a comb filter.

4. An apparatus for testing linearity of an analog to digital converter, comprising:

a controller that outputs a sampling frequency clock that is used to convert an analog signal into a digital signal having digitized code value, that digitally filters the digitized code value to provide a filtered code value according to a stored program, that generates a histogram based on the filtered code value, and that provides control to display the histogram;

a signal generator that generates a ground voltage and an analog triangular wave signal;

an analog to digital converter that converts the analog triangular wave signal generated by said signal generator into the digital signal and that outputs the digital signal;

a memory that stores the digitized code value of the digital signal provided by said analog to digital converter and that outputs the stored digitized code value to said controller for digital filtering, under control of said controller; and a display that displays the histogram generated by said controller, under control of said controller.

5. The apparatus of claim 4, wherein said controller functions as a finite impulse response filter to provide the filtered code value.

6. The apparatus of claim 5, wherein the finite impulse response filter is a comb filter.

7. The apparatus of claim 5, wherein said controller functions as the finite impulse response filter responsive to stored software programming.

8. The apparatus of claim 4, wherein said analog to digital converter converts the ground voltage into a digital voltage signal, and said controller generates a filter value responsive to the digital voltage signal and digitally filters the digitized code value using the filter value to provide the filtered code value.

9. A method of testing linearity of an analog to digital converter, comprising:

generating a ground voltage;

converting the ground voltage into a digital voltage value using the analog to digital converter;

determining a filter order responsive to the digital voltage value;

generating a digital filter value based on the determined filter order;

converting an analog triangular wave signal into a digital code value using the analog to digital converter;

digitally filtering the digital code value using the generated digital filter value, to eliminate noise from the digital code value; and generating a histogram responsive to the filtered digital code value, to analyze linearity of the analog to digital converter.

10. The method of claim 9, wherein said determining a filter order comprises:

storing the digital voltage value related to the ground voltage in a memory;

generating a first histogram responsive to the digital voltage value stored in the memory; and determining the filter order based on the first histogram.

11. The method of claim 10, wherein the filter order M is obtained using the following formula:

$$H(z)=1/(M+1)\Sigma Z^{-k},$$

wherein k=from 0 to M.

12. The method of claim 11, wherein the filter order M is determined in accordance with a number of captures per code at every half cycle of the ground voltage and a level of noise.

13. The method of claim 9, wherein said digitally filtering is carried out using the following formula:

$$Y[n]=\Sigma h[m]x[n-m],$$

wherein m=from 0 to M−1, Y[n] is a code value, h[m] is a filter value and M is the filter order.

14. The method of claim 13, wherein said digitally filtering is carried out as comb filtering based on stored software programming.

* * * * *